United States Patent
Stranieri et al.

(10) Patent No.: US 10,994,966 B2
(45) Date of Patent: May 4, 2021

(54) FIXTURE PLATE AND HOUSING

(71) Applicant: OTIS ELEVATOR COMPANY, Farmington, CT (US)

(72) Inventors: Paul A. Stranieri, Bristol, CT (US); Dennis Hanvey, Leonardo, NJ (US); Bruce F. Gallo, Farmington, CT (US); Leslie C. Watterson, Unionville, CT (US)

(73) Assignee: OTIS ELEVATOR COMPANY, Farmington, CT (US)

( * ) Notice: Subject to any disclaimer, the term of this patent is extended or adjusted under 35 U.S.C. 154(b) by 473 days.

(21) Appl. No.: 16/017,227

(22) Filed: Jun. 25, 2018

(65) Prior Publication Data
US 2019/0389691 A1 Dec. 26, 2019

(51) Int. Cl.
*H05K 5/02* (2006.01)
*H05K 5/00* (2006.01)
*B66B 1/34* (2006.01)

(52) U.S. Cl.
CPC ......... *B66B 1/3469* (2013.01); *H05K 5/0017* (2013.01); *H05K 5/0204* (2013.01); *H05K 5/0217* (2013.01); *H05K 5/0247* (2013.01)

(58) Field of Classification Search
CPC .. B66B 1/3469; H05K 5/0017; H05K 5/0204; H05K 5/0217; H05K 5/0247; H05K 5/0226; H05K 5/0239
USPC ........................................ 220/3.9, 3.8, 4.02
See application file for complete search history.

(56) References Cited

U.S. PATENT DOCUMENTS

| 2,529,990 | A | | 11/1950 | Barker |
| 2,532,528 | A | | 12/1950 | Zuley |
| 2,569,859 | A | | 10/1951 | Locke |
| 2,665,330 | A | | 1/1954 | Wong |
| 3,909,091 | A | | 9/1975 | Tantillo |
| 4,162,779 | A | | 7/1979 | Van Steenhoven et al. |
| 4,426,126 | A | * | 1/1984 | De Vos ................... F21V 21/03 248/222.51 |

(Continued)

FOREIGN PATENT DOCUMENTS

| CN | 202245584 U | 5/2012 |
| CN | 203411188 U | 1/2014 |

(Continued)

*Primary Examiner* — J. Gregory Pickett
*Assistant Examiner* — Niki M Eloshway
(74) *Attorney, Agent, or Firm* — Cantor Colburn LLP

(57) ABSTRACT

Disclosed is a fixture plate comprising a back plate defined by a member extending in a widthwise (W) direction and a height-wise (H) direction, a plurality of support arms including a first support arm and a second support arm connecting proximate a bottom edge of the back plate and spaced in the widthwise direction by a distance W1, each of the plurality of support arms comprising a compound profile defining a pivot section and a support section the pivot section extending arcuately downward along the height-wise direction to a first distal end, the support section comprising a first portion forming a support base, the support base extending perpendicularly away from the back plate to a second distal end, and a second portion that forms a hook portion, the hook portion extending upwardly along the height-wise direction to a third distal end to from a free end of the support section.

18 Claims, 9 Drawing Sheets

(56) References Cited

U.S. PATENT DOCUMENTS

| | | | |
|---|---|---|---|
| 4,837,669 A * | 6/1989 | Tharp | F21S 8/06 |
| | | | 362/147 |
| 5,829,554 A | 11/1998 | Benson et al. | |
| 5,862,889 A | 1/1999 | Sevilleja | |
| 6,127,630 A | 10/2000 | McKenzie et al. | |
| 6,293,510 B1 | 9/2001 | Bradford et al. | |
| 6,302,240 B1 | 10/2001 | Shih | |
| 6,484,850 B1 | 11/2002 | Kobayashi et al. | |
| 6,737,577 B1 * | 5/2004 | Liao | G06F 1/181 |
| | | | 174/50 |
| 6,739,432 B2 | 5/2004 | Elsener | |
| 7,102,079 B1 * | 9/2006 | Kurtin | H02G 3/00 |
| | | | 174/135 |
| 7,531,742 B2 | 5/2009 | Rupp | |
| 8,322,560 B2 * | 12/2012 | Jiang | G06F 1/1626 |
| | | | 220/677 |
| 8,485,319 B2 | 7/2013 | Peacock et al. | |
| 9,086,199 B2 * | 7/2015 | Wang | F21S 8/03 |
| 2008/0053698 A1 * | 3/2008 | Purves | H02G 3/16 |
| | | | 174/520 |
| 2010/0265669 A1 * | 10/2010 | Schnuerer | H05K 5/0204 |
| | | | 361/747 |
| 2011/0011997 A1 * | 1/2011 | Cheng | H05K 5/0204 |
| | | | 248/221.12 |
| 2017/0327343 A1 | 11/2017 | Okuda | |
| 2018/0017242 A1 * | 1/2018 | Johnson | H05K 5/0204 |
| 2020/0329570 A1 * | 10/2020 | Monroe | H05K 5/0017 |

FOREIGN PATENT DOCUMENTS

| | | |
|---|---|---|
| CN | 203568611 U | 4/2014 |
| CN | 203998487 U | 12/2014 |
| CN | 204265150 U | 4/2015 |
| CN | 104649089 A | 5/2015 |
| CN | 204802797 U | 11/2015 |
| CN | 205087729 U | 3/2016 |
| CN | 205892384 U | 1/2017 |
| CN | 106395571 A | 2/2017 |
| CN | 205932844 U | 2/2017 |
| CN | 206328025 U | 7/2017 |
| CN | 206985411 U | 2/2018 |
| EP | 1422181 A1 | 5/2004 |
| EP | 2470462 A1 | 7/2012 |
| EP | 3288883 A1 | 3/2018 |
| FR | 703334 A | 4/1931 |
| GB | 643226 A | 9/1950 |
| WO | 2007034694 A1 | 3/2007 |

\* cited by examiner

FIXTURE PLATE AND HOUSING

BACKGROUND

Exemplary embodiments pertain to the art of support plates and more specifically to a fixture plate that supports a housing when the housing is pivoted away from the fixture plate.

Destination dispatch fixtures may be mounted to the wall or in the wall of a customer's building. Previous fixtures may have required field mechanics to hold the fixture in their hand while performing the task of wiring the fixture. This may have been found to be challenging as well as cumbersome. It is desired to allow the fixture to be attached to a holding implement so that it may be wired without the need to hold the fixture in one's hand(s).

BRIEF DESCRIPTION

Disclosed is a fixture plate comprising a back plate defined by a member extending in a widthwise (W) direction and a height-wise (H) direction, a plurality of support arms including a first support arm and a second support arm connecting proximate a bottom edge of the back plate and spaced in the widthwise direction by a distance W1, each of the plurality of support arms comprising a compound profile defining a pivot section and a support section the pivot section extending arcuately downward along the height-wise direction to a first distal end, the support section comprising a first portion forming a support base, the support base extending perpendicularly away from the back plate to a second distal end, and a second portion that forms a hook portion, the hook portion extending upwardly along the height-wise direction to a third distal end to from a free end of the support section.

In addition to one or more of the above features or as an alternate the fixture plate comprises a plurality of sets of securing hooks including a height-wise lower set of securing hooks, the lower set of securing hooks including a first securing hook and a second securing hook widthwise aligned with the corresponding plurality of support arms and spaced height-wise by a distance H1 above the plurality of support arms.

In addition to one or more of the above features or as an alternate the plurality of sets of securing hooks includes a height-wise upper set of securing hooks, the upper set of securing hooks including a third securing hook and a fourth securing hook widthwise aligned with the corresponding plurality of support arms and spaced height-wise by a distance H2 above the plurality of support arms, wherein H2 is greater than H1.

In addition to one or more of the above features or as an alternate the fixture plate comprises a service orifice for extending one or more electrical service wires through the fixture plate, the service office being located widthwise intermediate the plurality of support arms and height-wise proximate the lower set of securing hooks.

In addition to one or more of the above features or as an alternate the fixture plate comprises a grounding connector located widthwise intermediate the plurality of support arms, and height-wise proximate the plurality of support arms and above the service office.

In addition to one or more of the above features or as an alternate the fixture plate comprises a plurality of connector slots including a height-wise lower plurality of connector slots, the lower plurality of connector slots including a first connector slot and a second connector slot 8, the lower plurality of connector slots being widthwise symmetrically distributed between the plurality of support arms and height-wise intermediate the plurality of support arms and the lower set of securing hooks.

In addition to one or more of the above features or as an alternate the plurality of connector slots includes a height-wise upper connector slot 8 widthwise intermediate the plurality of support arms and height-wise proximate the upper plurality of securing hooks.

In addition to one or more of the above features or as an alternate the fixture plate comprises a support bracket widthwise intermediate the plurality of support arms and height wise proximate the support base of the support section of the plurality of support arms.

In addition to one or more of the above features or as an alternate the support bracket contains a notch for receiving a connector.

In addition to one or more of the above features or as an alternate the fixture plate is metal.

Further disclosed a housing supported by a fixture plate having one or more of the above disclosed features. In addition the housing includes a back surface with a plurality of sets of slots, including a plurality of sets of support arm slots including a first set of support arm slots and a second set of support arm slots, the plurality of sets of support arm slots being widthwise spaced on the back surface for pivotally engaging the corresponding plurality of support arms of the fixture plate.

In addition to one or more of the above features or as an alternate each set of support arm slots in the housing includes a plurality of slot openings including a first slot opening and a second slot opening, the plurality of slot openings being height-wise adjacent, the first slot opening being height-wise below the second slot opening with a first cavity 8 formed therebetween within the housing, wherein a surface portion between the plurality of slot openings forms a pivot support brace.

In addition to one or more of the above features or as an alternate when the housing is pivoted away from the fixture plate, the plurality of support arms engages the corresponding plurality of support arm slots so that the pivot section extends into the first slot opening, the support base of the support section is against the pivot support brace, and the hook portion of the support section extends through the second slot opening to restrain motion of the housing that is perpendicular to the base plate, and a bottom edge of the back surface of the housing is against the bottom edge of the fixture plate and the back surface of the housing is substantially perpendicular to the back plate of the fixture plate, whereby the housing is supported by the fixture plate and the housing is prevented from pivoting further away from the from the fixture plate.

In addition to one or more of the above features or as an alternate the plurality of sets of slots in the housing includes a plurality of sets of securing slots including a lower set of securing slots and an upper set of securing slots, the plurality of sets of securing slots being height-wise spaced on the back surface for pivotally receiving the corresponding plurality of sets of securing hooks of the fixture plate.

In addition to one or more of the above features or as an alternate the housing comprises a second cavity which may be a service cavity for pivotally enclosing the service orifice, the grounding connector and the lower plurality of connector slots and the support bracket of the fixture plate.

In addition to one or more of the above features or as an alternate the service cavity in the housing includes a bottom surface that includes a connector slot opening through which a connector extends to engage the notch in the support bracket of the fixture plate.

In addition to one or more of the above features or as an alternate the service cavity in the housing includes a front surface and a top surface, at least one of which having a service aperture for receiving which one or more electrical service wires from the service orifice in the fixture plate.

In addition to one or more of the above features or as an alternate the housing comprises an upper slot for pivotally engaging the upper connector slot of the fixture plate.

In addition to one or more of the above features or as an alternate the housing is plastic.

In addition to one or more of the above features or as an alternate the housing encloses therein a controller for the elevator.

BRIEF DESCRIPTION OF THE DRAWINGS

The following descriptions should not be considered limiting in any way. With reference to the accompanying drawings, like elements are numbered alike.

DETAILED DESCRIPTION

A detailed description of one or more embodiments of the disclosed apparatus and method are presented herein by way of exemplification and not limitation with reference to the Figures.

Figure 1:
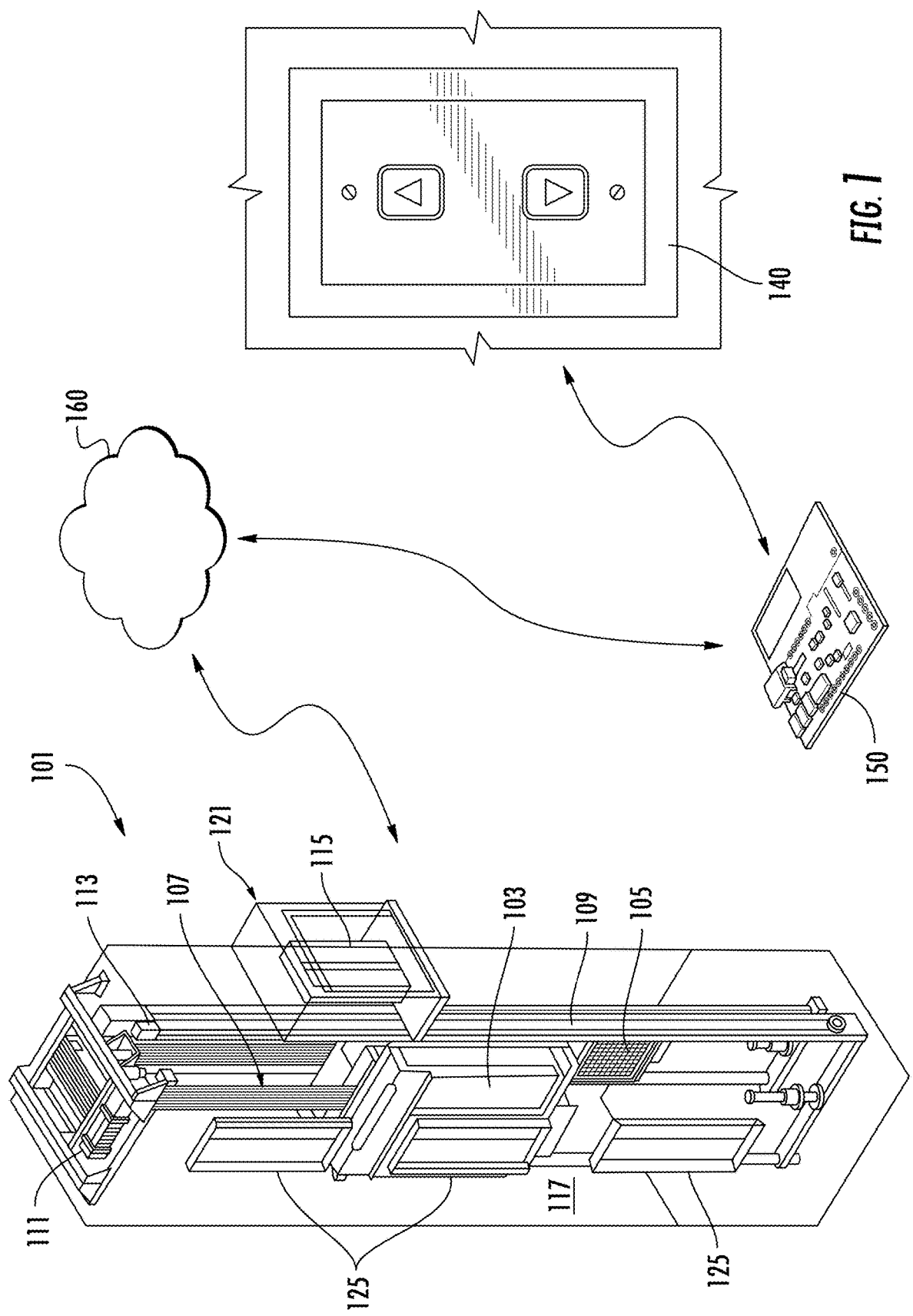
FIG. 1 is a schematic illustration of an elevator system that may employ various embodiments of the present disclosure.

FIG. 1 is a perspective view of an elevator system 101 including an elevator car 103, a counterweight 105, a tension member 107, a guide rail 109, a machine 111, a position reference system 113, and a controller 115. The elevator car 103 and counterweight 105 are connected to each other by the tension member 107. The tension member 107 may include or be configured as, for example, ropes, steel cables, and/or coated-steel belts. The counterweight 105 is configured to balance a load of the elevator car 103 and is configured to facilitate movement of the elevator car 103 concurrently and in an opposite direction with respect to the counterweight 105 within an elevator shaft 117 and along the guide rail 109.

The tension member 107 engages the machine 111, which is part of an overhead structure of the elevator system 101. The machine 111 is configured to control movement between the elevator car 103 and the counterweight 105. The position reference system 113 may be mounted on a fixed part at the top of the elevator shaft 117, such as on a support or guide rail, and may be configured to provide position signals related to a position of the elevator car 103 within the elevator shaft 117. In other embodiments, the position reference system 113 may be directly mounted to a moving component of the machine 111, or may be located in other positions and/or configurations as known in the art. The position reference system 113 can be any device or mechanism for monitoring a position of an elevator car and/or counter weight, as known in the art. For example, without limitation, the position reference system 113 can be an encoder, sensor, or other system and can include velocity sensing, absolute position sensing, etc., as will be appreciated by those of skill in the art.

The controller 115 is located, as shown, in a controller room 121 of the elevator shaft 117 and is configured to control the operation of the elevator system 101, and particularly the elevator car 103. For example, the controller 115 may provide drive signals to the machine 111 to control the acceleration, deceleration, leveling, stopping, etc. of the elevator car 103. The controller 115 may also be configured to receive position signals from the position reference system 113 or any other desired position reference device. When moving up or down within the elevator shaft 117 along guide rail 109, the elevator car 103 may stop at one or more landings 125 as controlled by the controller 115. Although shown in a controller room 121, those of skill in the art will appreciate that the controller 115 can be located and/or configured in other locations or positions within the elevator system 101. In one embodiment, the controller may be located remotely or in the cloud.

The machine 111 may include a motor or similar driving mechanism. In accordance with embodiments of the disclosure, the machine 111 is configured to include an electrically driven motor. The power supply for the motor may be any power source, including a power grid, which, in combination with other components, is supplied to the motor. The machine 111 may include a traction sheave that imparts force to tension member 107 to move the elevator car 103 within elevator shaft 117.

A call panel 140 may be operational by a user in a lobby to call the elevator 101. The call panel 140 may have a controller therein 150 for communicating with the elevator controller 115 directly or indirectly through a network 160.

Although shown and described with a roping system including tension member 107, elevator systems that employ other methods and mechanisms of moving an elevator car within an elevator shaft may employ embodiments of the present disclosure. For example, embodiments may be employed in ropeless elevator systems using a linear motor to impart motion to an elevator car. Embodiments may also be employed in ropeless elevator systems using a hydraulic lift to impart motion to an elevator car. FIG. 1 is merely a non-limiting example presented for illustrative and explanatory purposes.

Figure 2:
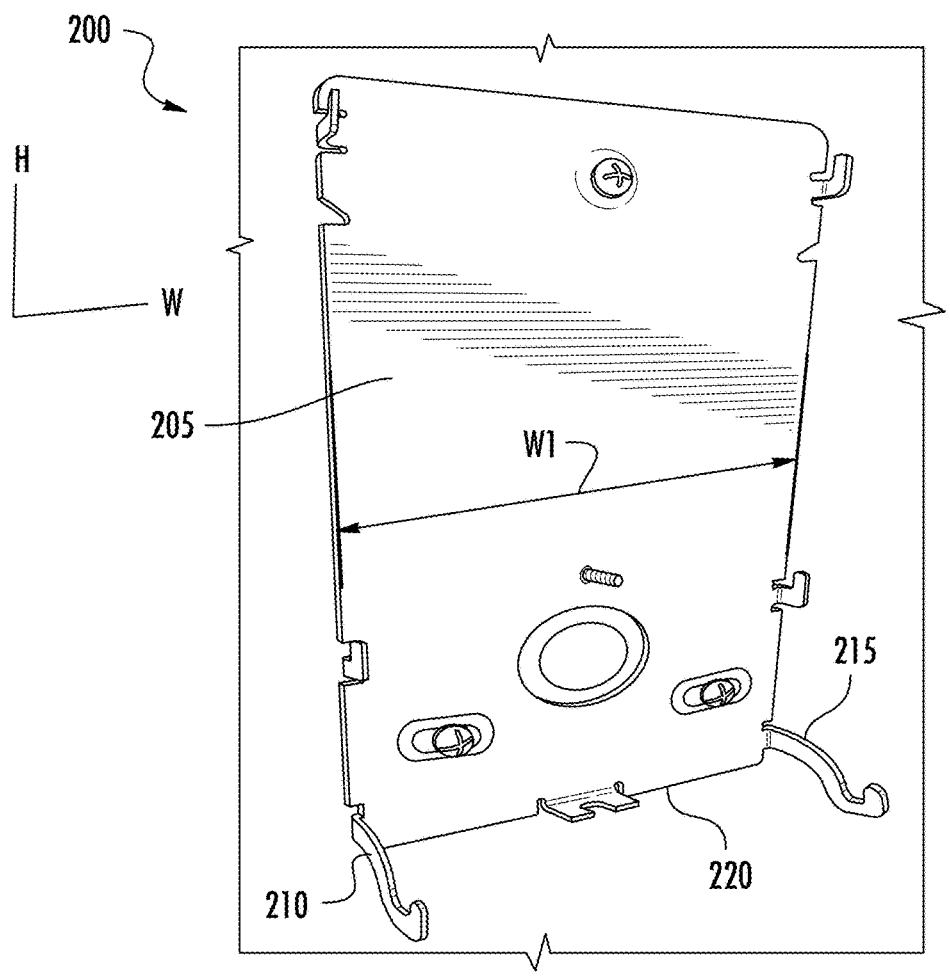
FIG. 2 is a fixture plate according to an embodiment.

Turning to FIG. 2, disclose is fixture plate 200 comprising a back plate 205 which may be defined by a planar member extending in a widthwise (W) direction and a height-wise (H) direction. A plurality of support arms may include a first support arm 210 and a second support arm 215 connected proximate a bottom edge 220 of the back plate 205 and spaced in the widthwise direction by a distance W1.

Figure 3:
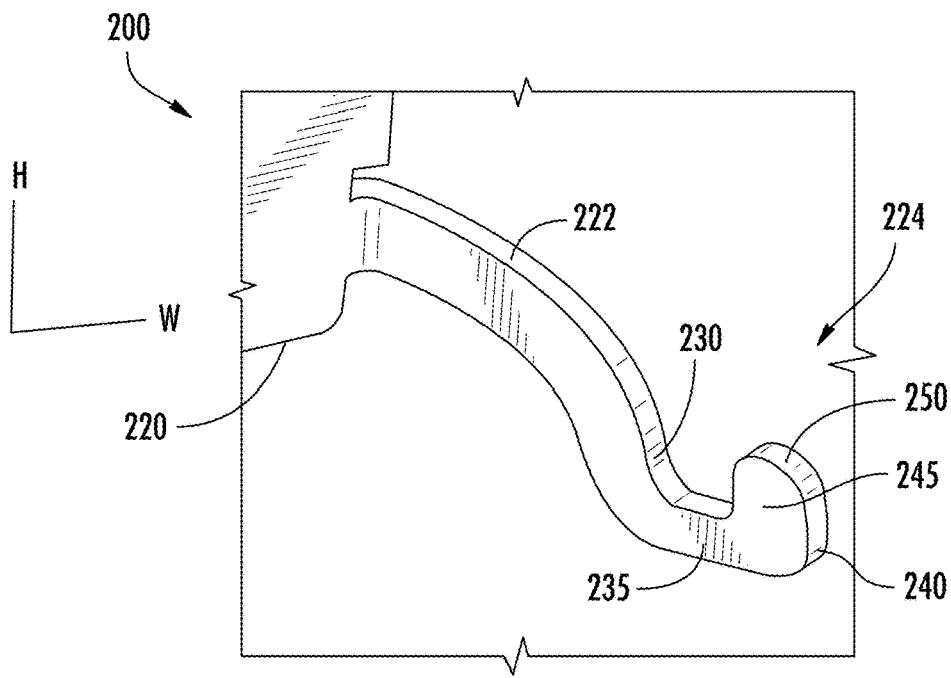
FIG. 3 is another view of the a fixture plate according to an embodiment.

Turning to FIG. 3, each of the plurality of support arms may comprise a compound profile defining a pivot section 222 and a support section 224. The pivot section 222 may extend arcuately downward along the height-wise direction to a first distal end 230. The support section 224 may comprise a first portion 235 forming a support base. The support base 235 of the support portion 224 may extend perpendicularly away from the back plate 205 to a second distal end 240. The support section 224 may further include a second portion 245 forming a hook portion. The hook portion 245 may extend upwardly along the height-wise direction to a third distal end 250 to form a free end of the support section 224.

Figure 4:
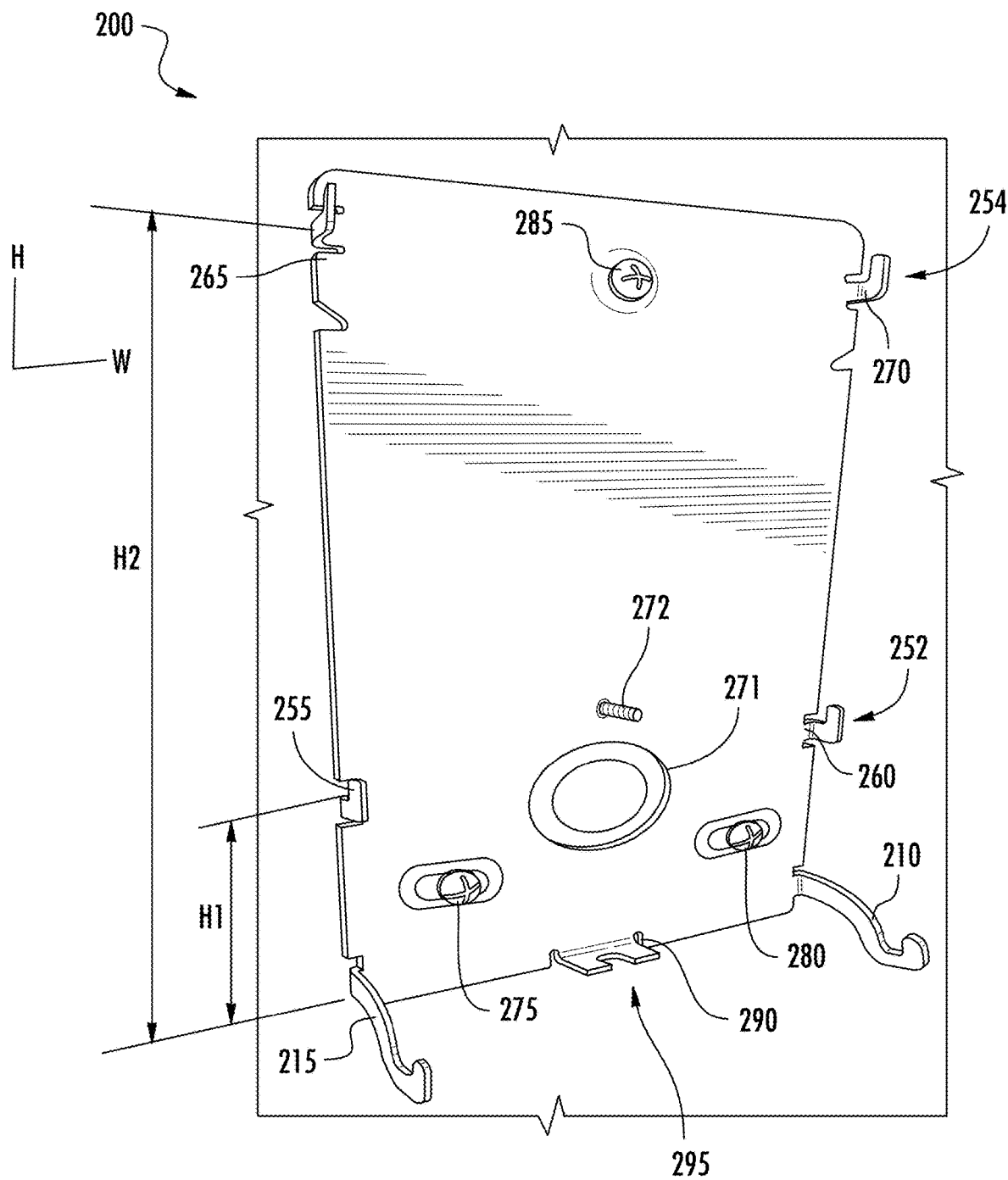
FIG. 4 is another view of the a fixture plate according to an embodiment.

With reference to FIG. 4, the fixture plate 200 may comprise a plurality of sets of securing hooks, including a height-wise lower set of securing hooks 252 and a height-wise upper set of securing hooks 254. The securing hooks may be up-turned J-hooks extending integrally from the back plate 205. The lower set of securing hooks 252 may include a first securing hook 255 and a second securing hook 260. The lower set of securing hooks 252 may be widthwise aligned with the corresponding plurality of support arms and spaced height-wise by a distance H1 above the plurality of support arms.

The height-wise upper set of securing hooks 254 may include a third securing hook 265 and a fourth securing hook 270. The upper set of securing hooks 254 may be widthwise aligned with the corresponding plurality of support arms and spaced height-wise by a distance H2 above the plurality of support arms. As illustrated, H2 may be greater than H1.

The fixture plate 200 may comprise a service orifice 271 for extending one or more electrical service wires through the fixture plate 200. There service orifice 271 may be located widthwise intermediate the plurality of support arms and spaced height-wise proximate the lower set of securing hooks. Typical service wires that may extend through the service office 271 include electrical, including power and ground, and telecommunication wires to connect with an elevator controller 150. A grounding connector 272 may be located widthwise intermediate the plurality of support arms, and height-wise proximate the plurality of support arms and above the service office 271. The grounding connector 272 may be a screw thread adapted to receive a grounding wire and nut to secure grounding wire.

A plurality of connector slots may be provided, including a height-wise lower plurality of connector slots. The lower plurality of connector slots may include a first connector slot 275 and a second connector slot 280. The lower plurality of connector slots may be widthwise symmetrically distributed between the plurality of support arms, and height-wise intermediate the plurality of support arms and the lower set of securing hooks. The plurality of connector slots includes a height-wise upper connector slot 285 widthwise intermediate the plurality of support arms and height-wise proximate the upper plurality of securing hooks. The connector slots are located to transfer weight from the support arms and securing hooks to a fixed structure such as a lobby wall. The connector slots may be bowed inwardly at their respective internal edges to create a spring effect when tightening screws that is, simulating the effect of a lock spring.

The fixture plate 200 may include a support bracket 290 widthwise intermediate the plurality of support arms and height wise proximate the support base 235 of the support section 224 of the plurality of support arms. The support bracket 290 may contain a notch 295 for receiving a connector, such as a threaded screw.

In one embodiment the fixture plate 200 may be metal. In one embodiment the fixture plate 200 may be stamped metal. Other sufficiently rigid materials are within the scope of the disclosure, though selection of materials may impact the need to use a grounding connector 272 as will be appreciated by one of ordinary skill.

Figure 5:
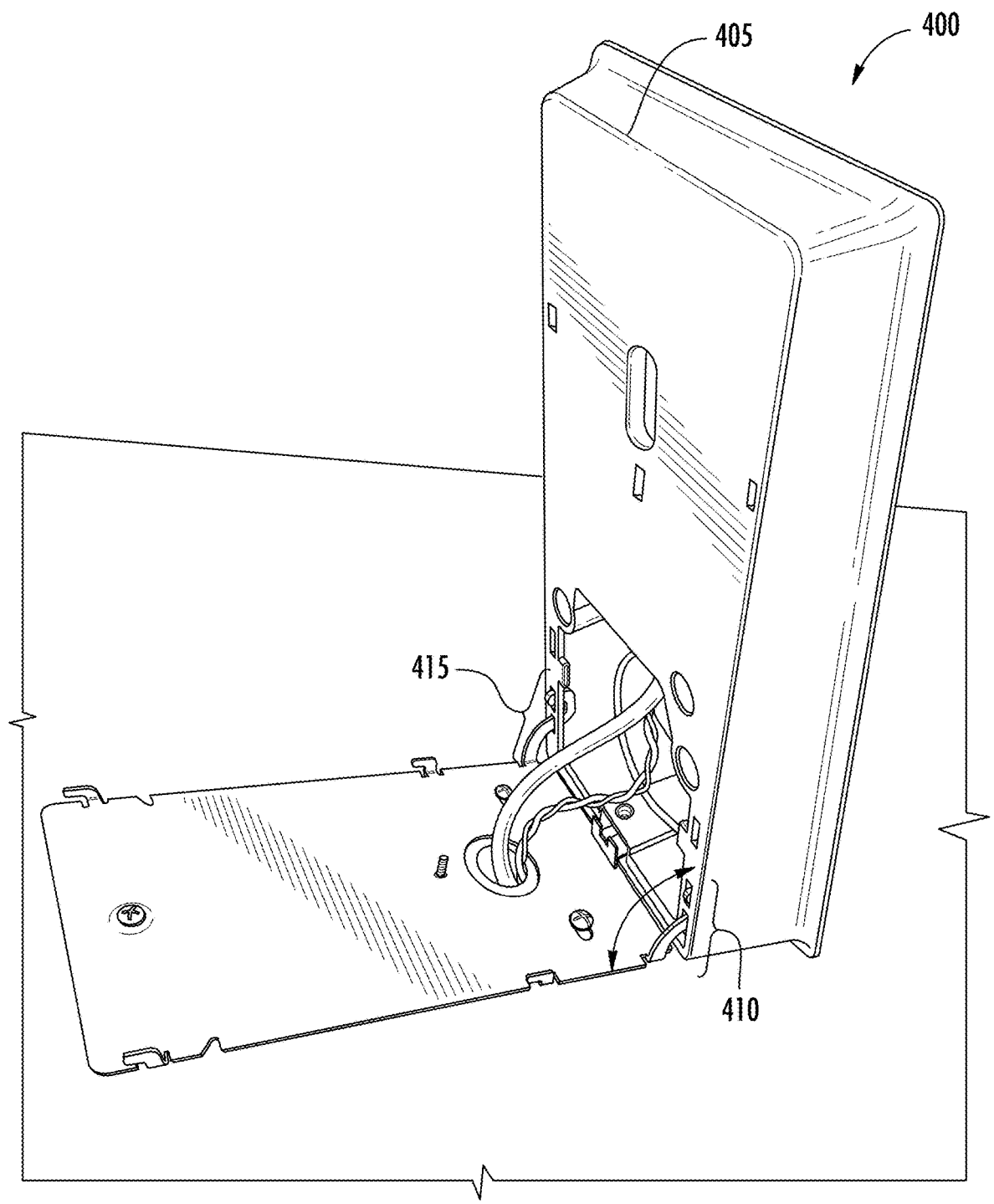
FIG. 5 is a view of the a fixture plate supporting a housing according to an embodiment.

Turning now to FIG. 5, a housing 400 is disclosed that may be supported by the fixture plate 200. The housing 400 may comprise a back surface 405 with a plurality of sets of slots. The slots in the housing 400 may include a plurality of sets of support arm slots including a first set of support arm slots 410 and a second set of support arm slots 415. The support arm slots may be widthwise spaced on the back surface 405 for pivotally engaging the corresponding plurality of support arms 210, 215 of the fixture plate 200.

Figure 6:
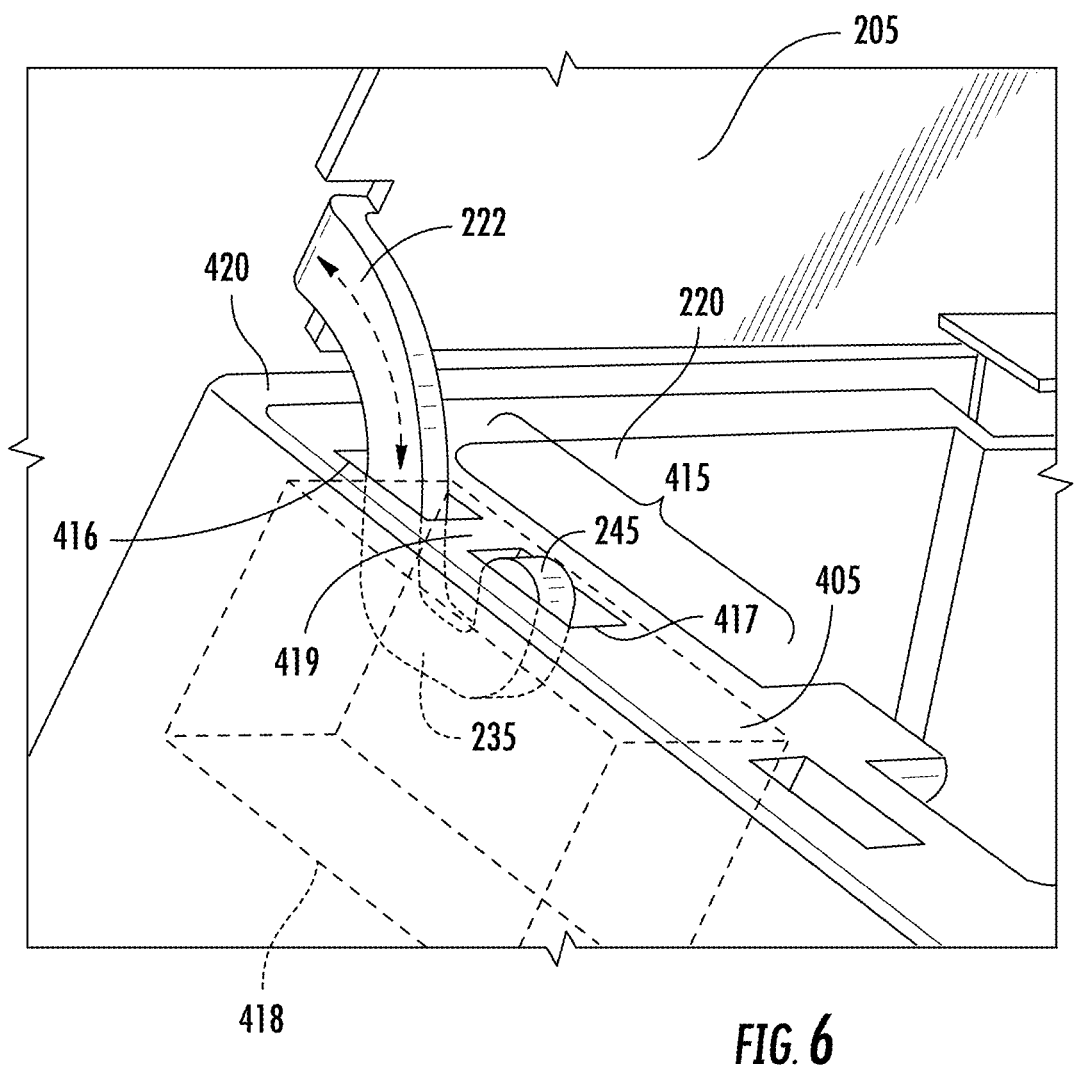
FIG. 6 is another view of the a fixture plate supporting a housing according to an embodiment.

Turning to FIG. 6, each set of support arm slots may include a plurality of slot openings including a first slot opening 416 and a second slot opening 417. The plurality of slot openings may be height-wise adjacent, and the first slot opening 416 may be height-wise below the second slot opening 417. A first cavity 418 may be formed therebetween within the housing 400. A surface portion 419 between the plurality of slot openings may form a pivot support brace for the housing 400.

When the housing 400 is pivoted away from the fixture plate 200, the plurality of support arms may engage the corresponding plurality of support arm slots. In this configuration the pivot section 222 may extend into the first slot opening 416 and the support base 235 of the support section 224 may be against the pivot support brace 419 of the housing 400. The hook portion 245 of the support section 224 may extend through the second slot opening 417 to restrain motion of the housing 400 that is perpendicular to the back plate 205.

In addition, when pivoted, a bottom edge 420 of the back surface 405 of the housing 400 may be against the bottom edge 220 of the fixture plate 200. At this time, the back surface 405 of the housing 400 may be substantially perpendicular to the back plate 205 of the fixture plate 200. From this configuration the housing 400 may supported by the fixture plate 200 and the housing 400 may be prevented from further pivoting about or translating away from the fixture plate 200.

Figure 7:
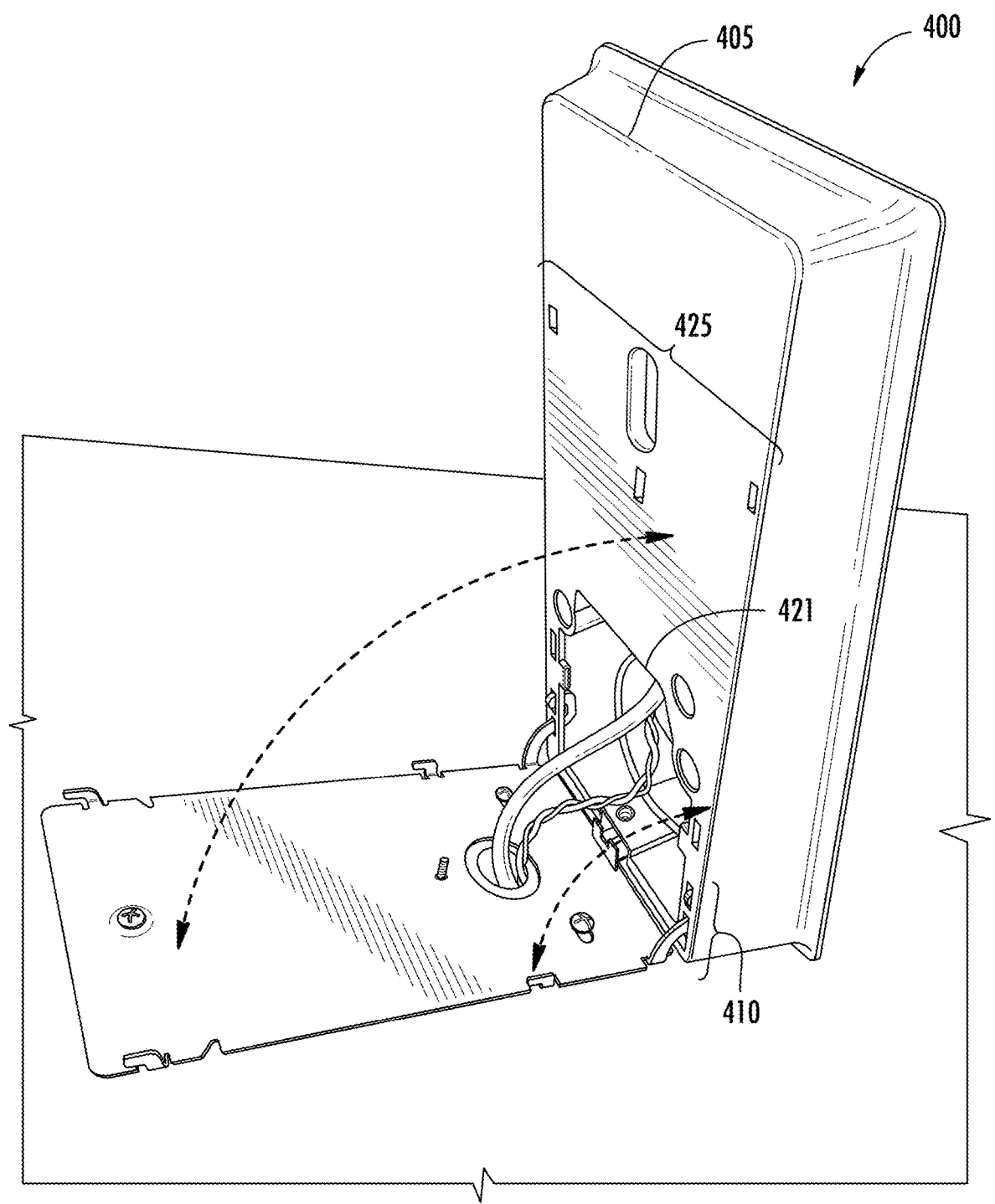
FIG. 7 is another view of the a fixture plate supporting a housing according to an embodiment.

Turning to FIG. 7, the plurality of sets of slots in the housing 400 may further include a plurality of sets of securing slots. The sets of securing slots may include a lower set of securing slots 421 and an upper set of securing slots 425. The sets of securing slots may be height-wise spaced on the back surface 405 for pivotally receiving the corresponding plurality of sets of securing hooks 252, 254 of the fixture plate 200.

Figure 8:
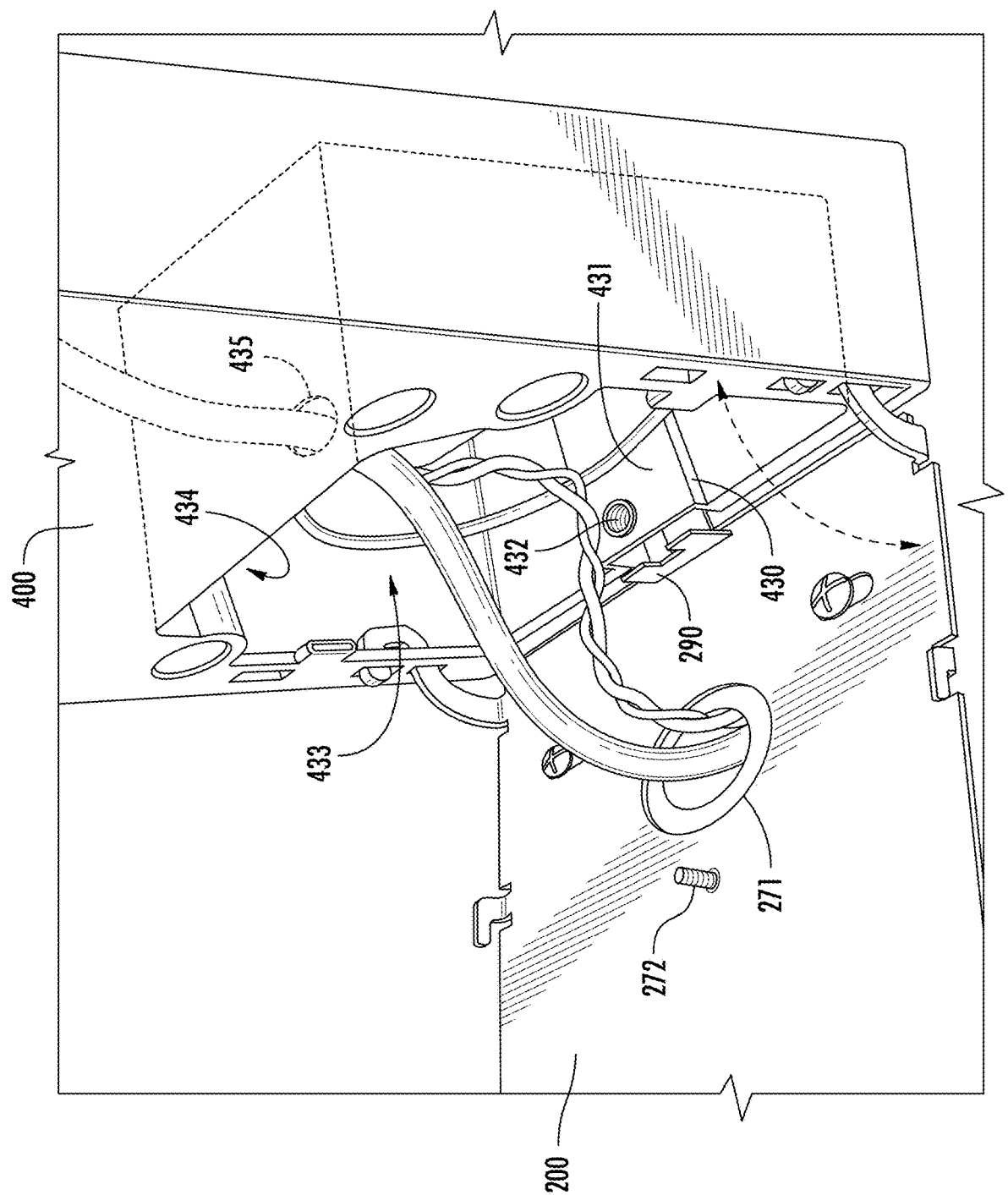
FIG. 8 is another view of the a fixture plate supporting a housing according to an embodiment.

Turning to FIG. 8, the housing 400 may include a second cavity 430, which may be a service cavity, for pivotally enclosing each of the service office 271, the grounding connector 272, the lower plurality of connector slots and the support bracket 290 of the fixture plate 200. The service cavity 430 may include a bottom surface 431 that may include a connector slot opening 432 through which a connector may extend to securely engage the notch 295 in the support bracket 290 of the fixture plate 200. The service cavity 430 may include a front surface 433 and a top surface 434. At least one of the front and top surfaces of the service cavity 430 may include a service aperture 435 through which one or more electrical service wires may extend through the service office 271 in the fixture plate 200.

Figure 9:
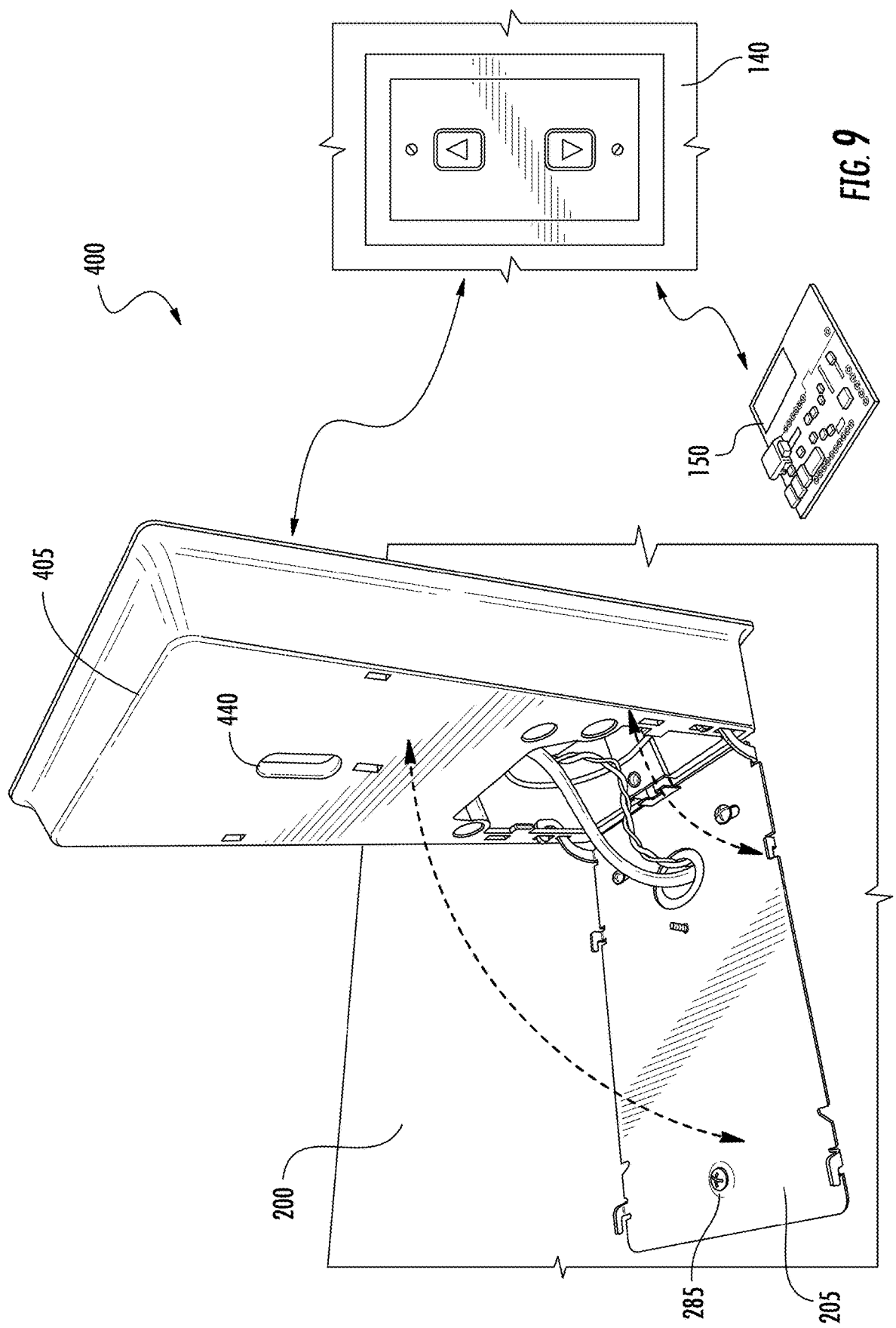
FIG. 9 is another view of the a fixture plate supporting a housing according to an embodiment.

Turning to FIG. 9 the housing 400 may include an upper slot 440 for pivotally engaging the upper connector slot 285 of the fixture plate 200. That is, with a screw head or other type of connector extending from the upper connector slot 285, the back surface 405 of housing 400 may be capable of sitting flush against the back plate 205 of the fixture plate 200.

More generally, in one embodiment the housing 400 may be manufactured from plastic. As indicated the housing 400 may store therein the call panel controller 150 and may have in a front thereof a call panel 140. Service electric wires identified above in the service cavity 430 may pass through the service aperture 435 in the service cavity 430 and to the controller 150.

As may be otherwise indicated above, disclosed embodiments may provide a wall plate composed of a metal material and a detail on the wall plate that forms a hinge type mechanism. The supported fixture or housing may be attached to the hinge and be allowed to stay in an open position (for example, at approximately 90 degrees from the wall). Such a configuration may assist a mechanic in performing the wiring task. The mechanic may therefore not have to hold the fixture in order to perform this task, which may allow for a relatively hands-free operation. The wall plate mechanism may be used with touch pads and touch screens that are part of the supported fixture. The disclosed support plate may enable, for example, an easier to install supported fixture and hands free wiring, which may reduce damage to wiring. The support plate may mitigate the chances of dropping the supported fixture while wiring. The support plate may be ergonomically better for installers.

Figure 10:
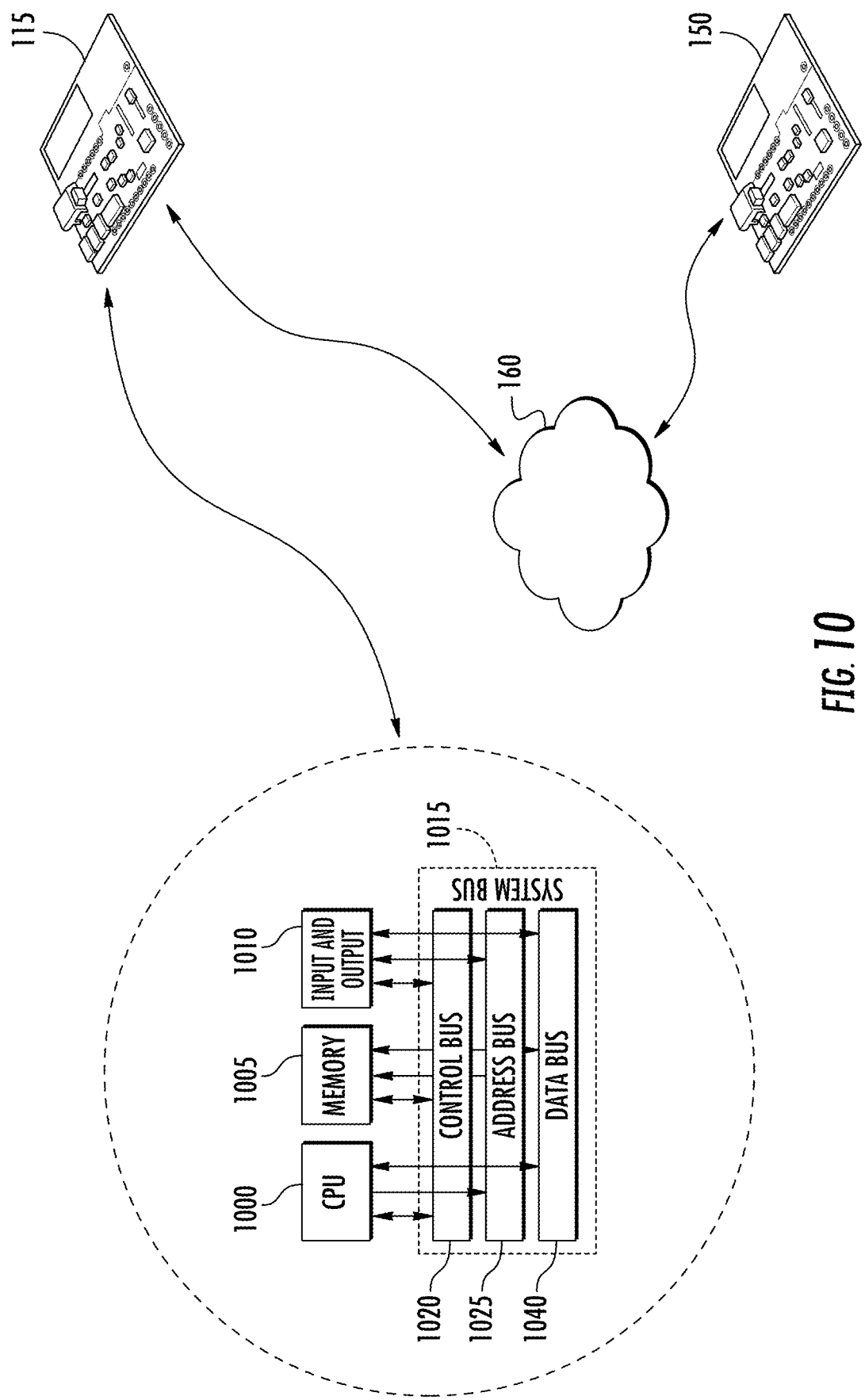
FIG. 10 illustrates technical features associated with one or more of the controllers disclosed in the application.

Turning now to FIG. 10, additional features of the controllers will be briefly disclosed. As indicated above, the controllers may include the elevator controller 115 and the call panel controller 150 which communicate over the network 160. The controllers may have substantially the same technology features. Accordingly, features of the controllers may be disclosed hereinafter with reference to the elevator controller 115, which may be generally referred to hereinafter as controller 115.

The controller 115 may be a computing device that includes processing circuitry that may further include an application specific integrated circuit (ASIC), an electronic circuit with one or more elemental circuit components such as resistors, an electronic processor (shared, dedicated, or group) 1000 and memory 1005 that executes one or more software algorithms or firmware algorithms and programs, contains relevant data which may be dynamically collected or disposed in one or more look-up tables, a combinational logic circuit that contains one or more operational amplifiers, and/or other suitable interfaces and components that provide the described functionality. For example, the processor 1000 processes data stored in the memory 1005 and employs the data in various control algorithms, diagnostics and the like.

The controller 115 may further include, in addition to a processor 1000 and memory 1005, one or more input and/or output (I/O) device interface(s) 1010 that are communicatively coupled via an onboard (local) interface to communicate among the plurality of controllers. The onboard interface may include, for example but not limited to, an onboard system bus 1015, including a control bus 1020 (for inter-device communications), an address bus 1025 (for physical addressing) and a data bus 1040 (for transferring data). That is, the system bus 1015 enables the electronic communications between the processor 1000, memory 1005 and I/O connections 1010. The I/O connections 1010 may also include wired connections and/or wireless connections. The onboard interface may have additional elements, which are omitted for simplicity, such as controllers, buffers (caches), drivers, repeaters, and receivers to enable electronic communications.

In operation, the processor 1000 onboard the controller 115 may be configured to execute software algorithms stored within the memory 1005, to communicate data to and from the memory 1005, and to generally control computing operations pursuant to the software algorithms. The algorithms in the memory 1005, in whole or in part, may be read by the processor 1000, perhaps buffered within the processor 1000, and then executed. The processor 1000 may include hardware devices for executing the algorithms, particularly algorithms stored in memory 1005. The processor 1000 may be a custom made or a commercially available processor 1000, a central processing units (CPU), an auxiliary processor among several processors associated with computing devices, semiconductor based microprocessors (in the form of microchips or chip sets), or generally any such devices for executing software algorithms.

The memory 1005 onboard the controller 115 may include any one or combination of volatile memory elements (e.g., random access memory (RAM, such as DRAM, SRAM, SDRAM, VRAM, etc.)) and/or nonvolatile memory elements (e.g., ROM, hard drive, tape, CD-ROM, etc.). Moreover, the memory 1005 may incorporate electronic, magnetic, optical, and/or other types of storage media. The memory 1005 may also have a distributed architecture, where various components are situated remotely from one another, but may be accessed by the processor 1000.

The software algorithms in the memory 1005 onboard the controller 115 may include one or more separate programs, each of which includes an ordered listing of executable instructions for implementing logical functions. A system component embodied as software algorithms may be construed as a source program, executable program (object code), script, or any other entity comprising a set of instructions to be performed. When constructed as a source program, the software algorithms may be translated via a compiler, assembler, interpreter, or the like, which may or may not be included within the memory.

Some of the input/output (I/O) devices that may be coupled to the controller 115 using the system I/O Interface(s) 1010, the wired interfaces and/or the wireless interfaces will now be identified but the illustration of which shall be omitted for brevity. Such I/O devices include, but are not limited to (i) input devices such as a keyboard, mouse, scanner, microphone, camera, proximity device, etc., (ii) output devices such as a printer, display, etc., and (iii) devices that communicate both as inputs and outputs, such as a modulator/demodulator (modem; for accessing another device, system, or network), a radio frequency (RF) or other transceiver, a telephonic interface, a bridge, a router, etc.

Further, using the wireless connection, the controller 115 may communicate over the network 160 by applying electronic short range communication (SRC) protocols.

Such protocols may include local area network (LAN) protocols and/or a private area network (PAN) protocols. LAN protocols include Wi-Fi technology, which is a technology based on the Section 802.11 standards from the Institute of Electrical and Electronics Engineers, or IEEE. PAN protocols include, for example, Bluetooth Low Energy (BTLE), which is a wireless technology standard designed and marketed by the Bluetooth Special Interest Group (SIG) for exchanging data over short distances using short-wavelength radio waves. PAN protocols also include Zigbee, a technology based on Section 802.15.4 protocols from the Institute of Electrical and Electronics Engineers (IEEE). More specifically, Zigbee represents a suite of high-level communication protocols used to create personal area networks with small, low-power digital radios for low-power low-bandwidth needs, and is best suited for small scale projects using wireless connections. Such wireless connection may include Radio-frequency identification (RFID) technology, which is another SRC technology used for communicating with an integrated chip (IC) on an RFID smartcard.

One should note that the above disclosed architecture, functionality, and/or hardware operations of the controller 115 may be implemented using software algorithms. In the software algorithms, such functionality may be represented as a module, segment, or portion of code, which comprises one or more executable instructions for implementing the specified logical function(s). It should also be noted that such modules may not necessarily be executed in any particular order and/or executed at all.

One should also note that any of the functionality of the controller 115 described herein can be embodied in any non-transitory computer-readable medium for use by or in connection with an instruction execution system, apparatus, or device, such as a computer-based system, processor-containing system, or other system that can fetch the instructions from the instruction execution system, apparatus, or device and execute the instructions. In the context of this document, a "computer-readable medium" contains, stores, communicates, propagates and/or transports the program for use by or in connection with the instruction execution system, apparatus, or device.

Further, the computer readable medium in the controller 115 may include various forms of computer readable memory 1005. For example the computer readable memory 1005 may be integral to an apparatus or device, which may include one or more semiconductors, and in which the communication and/or storage technology may be one or more of electronic, magnetic, optical, electromagnetic or infrared. More specific examples (a non-exhaustive list) of a computer-readable medium the illustration of which being omitted for brevity include a portable computer diskette (magnetic), a random access memory (RAM) (electronic), a read-only memory (ROM) (electronic), an erasable programmable read-only memory (EPROM or Flash memory) (electronic), and a portable compact disc read-only memory (CDROM) (optical).

In addition, the above distributed system of controllers is not intended to be limiting. In one embodiment, each of the controllers on the same side of the network may be the same device such that no network therebetween is required. In one embodiment a single on-site controller is provided instead of the distributed system of controllers. In one embodiment the controllers on the same side of the network are controlled by servers located over the World Wide Web, using a cloud computing configuration. In one embodiment, the distributed controller network is hard-wired for all telecommunication services so that no wireless network is necessary. In one embodiment redundant wireless and wired networks are utilized which automatically switch between such services to minimize network congestion.

The term "about" is intended to include the degree of error associated with measurement of the particular quantity based upon the equipment available at the time of filing the application.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. A fixture plate, comprising,
a back plate defined by a member extending in a width-wise direction and a height-wise direction;
a plurality of support arms including a first support arm and a second support arm connecting proximate a bottom edge of the back plate and spaced in the widthwise direction by a distance W1,
wherein each of the plurality of support arms comprises a compound profile defining a pivot section and a support section,
wherein the pivot section extends arcuately downward along the height-wise direction to a first distal end, and
wherein the support section comprises:
a first portion forming a support base, the support base extending perpendicularly away from the back plate to a second distal end, and
a second portion that forms a hook portion, the hook portion extending upwardly along the height-wise direction to a third distal end to from a free end of the support section; and
a plurality of sets of securing hooks including a height-wise lower set of securing hooks, the height-wise lower set of securing hooks including a first securing hook and a second securing hook widthwise aligned with the corresponding plurality of support arms and spaced height-wise by a distance H1 above the plurality of support arms,
wherein the plurality of sets of securing hooks includes a height-wise upper set of securing hooks, the height-wise upper set of securing hooks including a third securing hook and a fourth securing hook widthwise aligned with the corresponding plurality of support arms and spaced height-wise by a distance H2 above the plurality of support arms, wherein H2 is greater than H1.

2. The fixture plate of claim 1, comprising a service orifice for extending one or more electrical service wires through the fixture plate, the service orifice being located widthwise intermediate the plurality of support arms and height-wise proximate the height-wise lower set of securing hooks.

3. The fixture plate of claim 2, comprising a grounding connector located widthwise intermediate the plurality of support arms, and height-wise proximate the plurality of support arms and above the service orifice.

4. The fixture plate of claim 3, comprising a plurality of connector slots including a height-wise lower plurality of connector slots, the height-wise lower plurality of connector slots including a first connector slot and a second connector slot, the height-wise lower plurality of connector slots being widthwise symmetrically distributed between the plurality of support arms and height-wise intermediate the plurality of support arms and the height-wise lower set of securing hooks.

5. The fixture plate of claim 4, wherein the plurality of connector slots includes a height-wise upper connector slot widthwise intermediate the plurality of support arms and height-wise proximate the height-wise upper set of securing hooks.

6. The fixture plate of claim 5, comprising a support bracket, widthwise intermediate the plurality of support arms and height wise proximate the support base of the support section of the plurality of support arms.

7. The fixture plate of claim 6, wherein the support bracket contains a notch for receiving a connector.

8. A housing supported by the fixture plate of claim 7, the housing comprising a back surface with a plurality of sets of slots, including:
- a plurality of sets of support arm slots including a first set of support arm slots and a second set of support arm slots, the plurality of sets of support arm slots being widthwise spaced on the back surface for pivotally engaging the corresponding plurality of support arms of the fixture plate.

9. The housing of claim 8, wherein each set of support arm slots includes:
- a plurality of slot openings including a first slot opening and a second slot opening, the plurality of slot openings being height-wise adjacent, the first slot opening being height-wise below the second slot opening with a first cavity formed therebetween within the housing,
- wherein a surface portion, between the plurality of slot openings, forms a pivot support brace.

10. The housing of claim 9, wherein when the housing pivoted away from the fixture plate,
- the plurality of support arms engages the corresponding plurality of sets of support arm slots so that the pivot section extends into the first slot opening, the support base of the support section is against the pivot support brace, and the hook portion of the support section extends through the second slot opening to restrain motion of the housing that is perpendicular to the back plate, and
- a bottom edge of the back surface of the housing is against the bottom edge of the fixture plate and the back surface of the housing is substantially perpendicular to the back plate of the fixture plate,
- whereby the housing is supported by the fixture plate and the housing is prevented from pivoting further away from the from the fixture plate.

11. The housing of claim 10, wherein the plurality of sets of slots includes
- a plurality of sets of securing slots including a lower set of securing slots and an upper set of securing slots, the plurality of sets of securing slots being height-wise spaced on the back surface for pivotally receiving the corresponding plurality of sets of securing hooks of the fixture plate.

12. The housing of claim 11, comprising a second cavity which may be a service cavity for pivotally enclosing the service orifice, a grounding connector and the height-wise lower plurality of connector slots and the support bracket of the fixture plate.

13. The housing of claim 12, wherein the service cavity includes a bottom surface that includes a connector slot opening through which connector extends to engage the notch in the support bracket of the fixture plate.

14. The housing of claim 13, wherein the service cavity includes a front surface and a top surface, at least one of which having a service aperture for receiving the one or more electrical service wires from the service orifice in the fixture plate.

15. The housing of claim 8, comprising an upper slot for pivotally engaging the height-wise upper connector slot of the fixture plate.

16. The housing of claim 8, wherein the housing is plastic.

17. The housing of claim 8, wherein the housing encloses therein a controller for an elevator.

18. The fixture plate of claim 1, wherein the fixture plate is metal.

* * * * *